United States Patent
Miyake et al.

(10) Patent No.: US 6,320,659 B1
(45) Date of Patent: Nov. 20, 2001

(54) CLEARANCE MEASURING DEVICE AND METHOD FOR EXPOSURE

(75) Inventors: Eiichi Miyake; Ken Miyake, both of Amagasaki (JP)

(73) Assignee: Sanei Giken Co., Ltd., Hyogo (JP)

( * ) Notice: Subject to any disclaimer, the term of this patent is extended or adjusted under 35 U.S.C. 154(b) by 0 days.

(21) Appl. No.: 09/523,725

(22) Filed: Mar. 13, 2000

(30) Foreign Application Priority Data

Sep. 22, 1998 (JP) .................................................. 10-268093
Jan. 21, 2000 (JP) .................................................. 12-012538

(51) Int. Cl.$^7$ .................................................. G01B 11/00
(52) U.S. Cl. ............................ 356/401; 356/505; 355/53
(58) Field of Search ............................ 356/399–401, 356/372, 373, 505; 355/53, 67, 50, 51; 430/5, 20, 22, 30, 311

(56) References Cited

U.S. PATENT DOCUMENTS 4,618,261 10/1986 Flanders et al. .
5,573,877 11/1996 Inou et al. .
5,751,404 * 5/1998 Murakami et al. ..................... 355/53
5,850,279 * 12/1998 Nara et al. ............................. 356/53
6,160,611 * 12/2000 Miyake .................................. 355/53

FOREIGN PATENT DOCUMENTS 0 184 820 A2    2/1985   (EP) .
61-144649       7/1986   (JP) .
4-258708    *   9/1992   (JP) .
11194501 A      7/1999   (JP) .

* cited by examiner

*Primary Examiner*—Hoa Q. Pham
(74) *Attorney, Agent, or Firm*—McDermott, Will & Emery (57) ABSTRACT

A position of an image or shadow of a clearance measuring mark projected onto a plate with respect to a position of clearance measuring mark on a photomask is sensed as image data by a CCD camera and subjected to an image process by a processor. Based on a relative positional relationship between image or shadow of a clearance measuring mark and clearance measuring mark, the clearance between photomask and plate can be adjusted to a prescribed value by a clearance adjusting device. As a result, a clearance measuring device and method can be provided capable of accurately and inexpensively measuring the clearance between the plate and the photomask in the exposure apparatus.

14 Claims, 10 Drawing Sheets

CLEARANCE MEASURING DEVICE AND METHOD FOR EXPOSURE

BACKGROUND OF THE INVENTION

1. Field of the Invention

The present invention relates to clearance measuring devices and methods and, more specifically to a clearance measuring device and method used for adjusting a clearance between a photomask and a plate in an exposure apparatus.

2. Description of the Background Art

Recently, a method of transferring a pattern on a photomask onto a plate by exposure while ensuring a small clearance between the photomask and the plate has been widely used. Such an exposure method is called an off contact exposure method or proximity exposure method.

In the off contact exposure method and proximity exposure method, a clearance between a photomask and a plate must be measured and adjusted by a highly reliable method. For example, the clearance between the photomask and the plate is generally adjusted to be from 0.05 mm to 0.5 mm.

Figure 12:
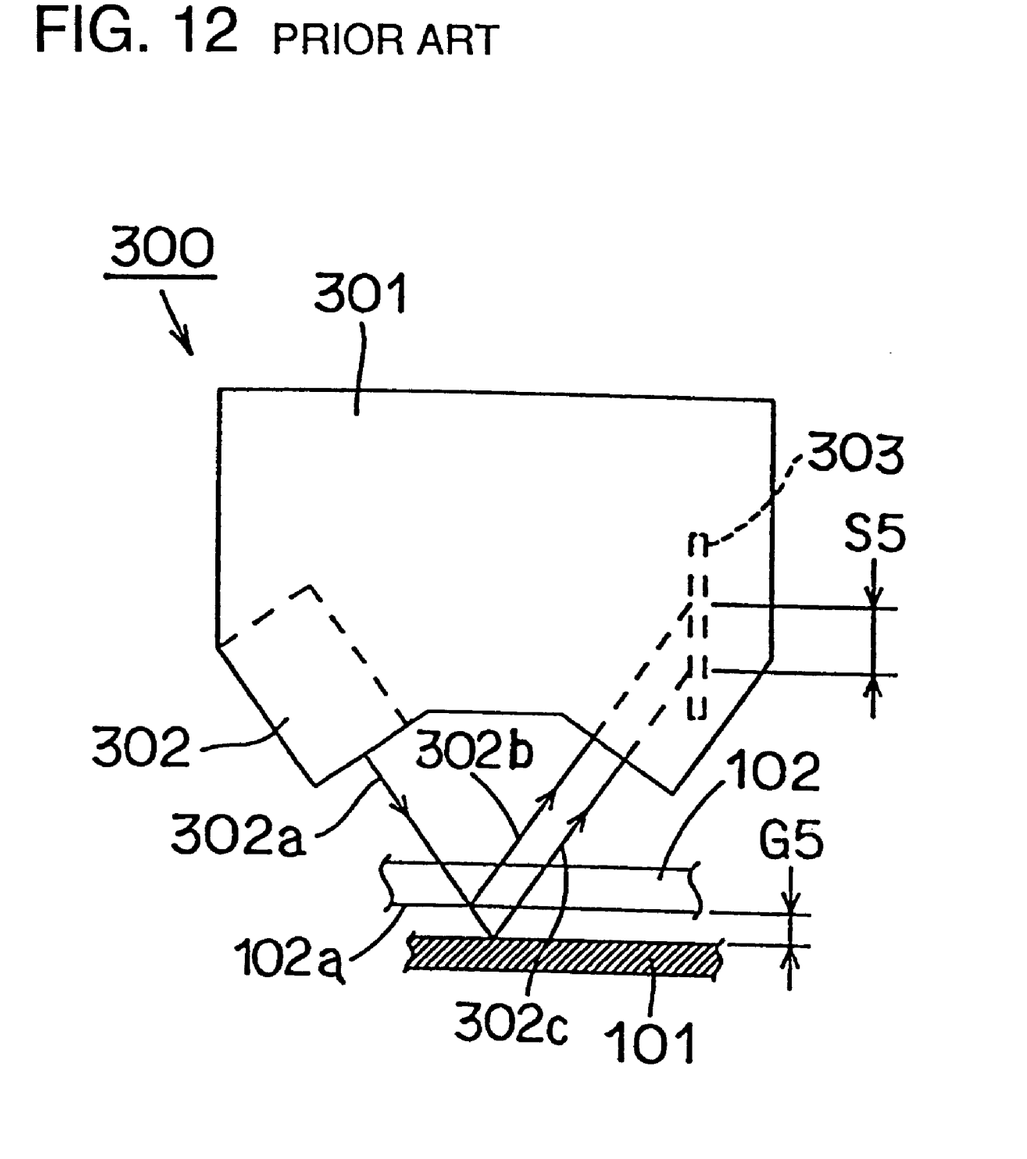
FIG. 12 is a diagram showing a clearance measuring device 300 of the conventional art for measuring a clearance between a photomask and a plate, as well as plate 101 and photomask 102 which are spaced by a clearance G5.

Now, a conventional method of measuring a clearance between a photomask and a plate will be described with reference to FIG. 12. Shown in FIG. 12 are a clearance measuring device 300 for measuring the clearance between the photomask and the plate, and plate 101 and photomask 102 spaced apart by a clearance G5.

Clearance measuring device 300 includes in a box 301: a laser light source 302 for diagonally and downwardly directing light 302a to plate 101 and photomask 102; and a light sensor 303 sensing the light reflected by plate 101 and photomask 102.

Light 302a is divided into light 302b reflected by a surface 102a of photomask 102 which is opposite to plate 101, and light 302c reflected by a surface 101a of plate 101 which is opposite to photomask 102. Light 302b and 302c are sensed by light sensor 303, and a distance S5 between light 302b and 302c is calculated by a processor (not shown).

Here, as distance S5 is proportional to clearance G5, clearance G5 can be preliminary adjusted to provide a given distance S5.

However, conventional clearance measuring device 300 is expensive. If a plurality of clearance measuring devices 300 must be provided to measure the clearance between plate 101 and photomask 102 at a plurality of locations, the problem associated with a cost arises.

Further, conventional clearance measuring device 300 requires a processor in addition to the device used for aligning photomask 102 and plate 101. As a result, the problem associated with the cost arises and the structure of the clearance measuring device becomes complicated.

Moreover, conventional clearance measuring device 300 requires laser light source 302 and light sensor 303 in addition to these at used for aligning photomask 102 and plate 101. Thus, the structure of the clearance measuring device becomes complicated.

When the pattern on photomask 102 is transferred onto plate 101 by exposure, a mechanism for moving clearance measuring device 300 outside photomask 101 must be provided. Thus, the structure of the clearance measuring device becomes complicated.

SUMMARY OF THE INVENTION

An object of the present invention is to provide a clearance measuring device and method capable of accurately and inexpensively measuring a clearance between a plate and a photomask.

Another object of the present invention is to provide a clearance measuring device and method capable of easily and inexpensively measuring a clearance between a plate and a photomask when the clearance is to be measured at a plurality of locations.

According to the present invention, a clearance measuring device is provided which measures a clearance between a photomask and a plate for adjusting it to a prescribed value based on the measurement data in an exposure apparatus transferring a pattern on the photomask onto the plate by exposing the plate to light through the photomask. The photomask has a mark used for measuring a clearance (hereinafter referred to as a clearance measuring mark) in a prescribed position on a surface opposite to the plate. The clearance measuring device includes: at least one light sensor sensing an image of the clearance measuring mark on the plate or a shadow of the clearance measuring mark projected on the plate when light is directed to the clearance measuring mark and a region including the clearance measuring mark; a processor calculating the clearance between the photomask and the plate based on a relative positional relationship between the image or shadow of the clearance measuring mark on the plate and the clearance measuring mark; and a clearance adjusting device adjusting the clearance between the photomask and the plate to a prescribed value by relatively moving the photomask and the plate based on the calculation result obtained by the processor.

According to the present invention, a clearance measuring method of an exposure apparatus transferring a pattern on a photomask having a clearance measuring mark onto a plate by exposing the plate to light through the photomask is provided in which the clearance between the photomask and the plate is measured and adjusted to a prescribed value based on a measurement data. In the clearance measuring method, the clearance between the photomask and the plate is calculated based on a relative positional relationship between an image or shadow of the clearance measuring mark on the plate and the clearance measuring mark when the light is directed to a region including the clearance measuring mark, and the clearance between the photomask and the plate is adjusted to a prescribed value by relatively moving the photomask and the plate based on the calculation result.

According to the clearance measuring device and method, when light is directed to the region including the clearance measuring mark on the photomask, a prescribed clearance between the photomask and the plate ensures the image or shadow of the clearance measuring mark on the plate.

The relative positional relationship between the clearance measuring mark of the photomask and the image or shadow of the clearance measuring mark, for example, an amount of displacement thereof, changes in accordance with the clearance between the photomask and the plate. In other words, the displacement between the clearance measuring mark of the photomask and the image or shadow of the clearance measuring mark is proportional to the clearance between the photomask and the plate.

Thus, the clearance measuring mark on the photomask and the image or shadow of the clearance measuring mark are sensed by the light sensor, and an amount of displacement of the clearance measuring mark on the photomask and the image or the shadow of the clearance measuring mark or the like can be calculated by the processor performing for example an image process.

As a result, the clearance between the photomask and the plate can accurately be adjusted to a prescribed value by the clearance adjusting device based on the calculation result.

Further, to implement the clearance measuring device and method in a more preferred manner, the clearance between the photomask and the plate may accurately be adjusted to a prescribed value by the clearance adjusting device based on an amount of difference in shape between the clearance measuring mark and the image or shadow of the clearance measuring mark or the like.

Preferably, an alignment mark for aligning the photomask and the plate or a portion of the pattern on the photomask to be transferred onto the plate may be used as the clearance measuring mark. Thus, the clearance measuring device and method of the present invention are achieved without increasing the number of patterns to be formed on the photomask.

Preferably, the light sensor is used which is provided with a mechanism movable in X and Y directions of the photomask. Thus, the light sensor can move in X and Y directions of the photomask, so that the clearance between the plate and the photomask can readily be measured at a plurality of locations.

To implement the clearance measuring device and method in a more preferred manner, the light sensor may be provided with a mechanism capable of moving in a direction perpendicular to the surface of the photomask.

Further, to implement the clearance measuring device and method in the more preferred manner, a mechanism capable of adjusting an angle of the light sensor may be provided.

To implement the clearance measuring device and method in the more preferred manner, at least one mirror may be used for the light sensor for sensing the clearance measuring mark or the image or shadow of the clearance measuring mark by the light sensor.

Preferably, a processor for aligning the photomask and the plate is used as the above mentioned processor. Thus, a dedicated processor is not necessary and a mechanism of the clearance measuring device can be simplified.

The light sensor may be used for aligning the photomask and the plate. Thus, a dedicated light sensor is not necessary and the mechanism of the clearance measuring device can be simplified.

To implement the clearance measuring device and the method in the more preferred manner, at least one light irradiation device for irradiating the region including the clearance measuring mark with light may be provided.

The light irradiation device may be used for aligning the photomask and the plate. Thus, a dedicated light irradiation device is not necessary and the mechanism of the clearance device can be simplified.

To implement the clearance measuring device and method in the more preferred manner, for example, at least one mirror may be provided for the optical system as the light irradiation device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the clearance measuring device and method of the present invention will now be described with reference to the drawings.

First Embodiment

Figure 1:
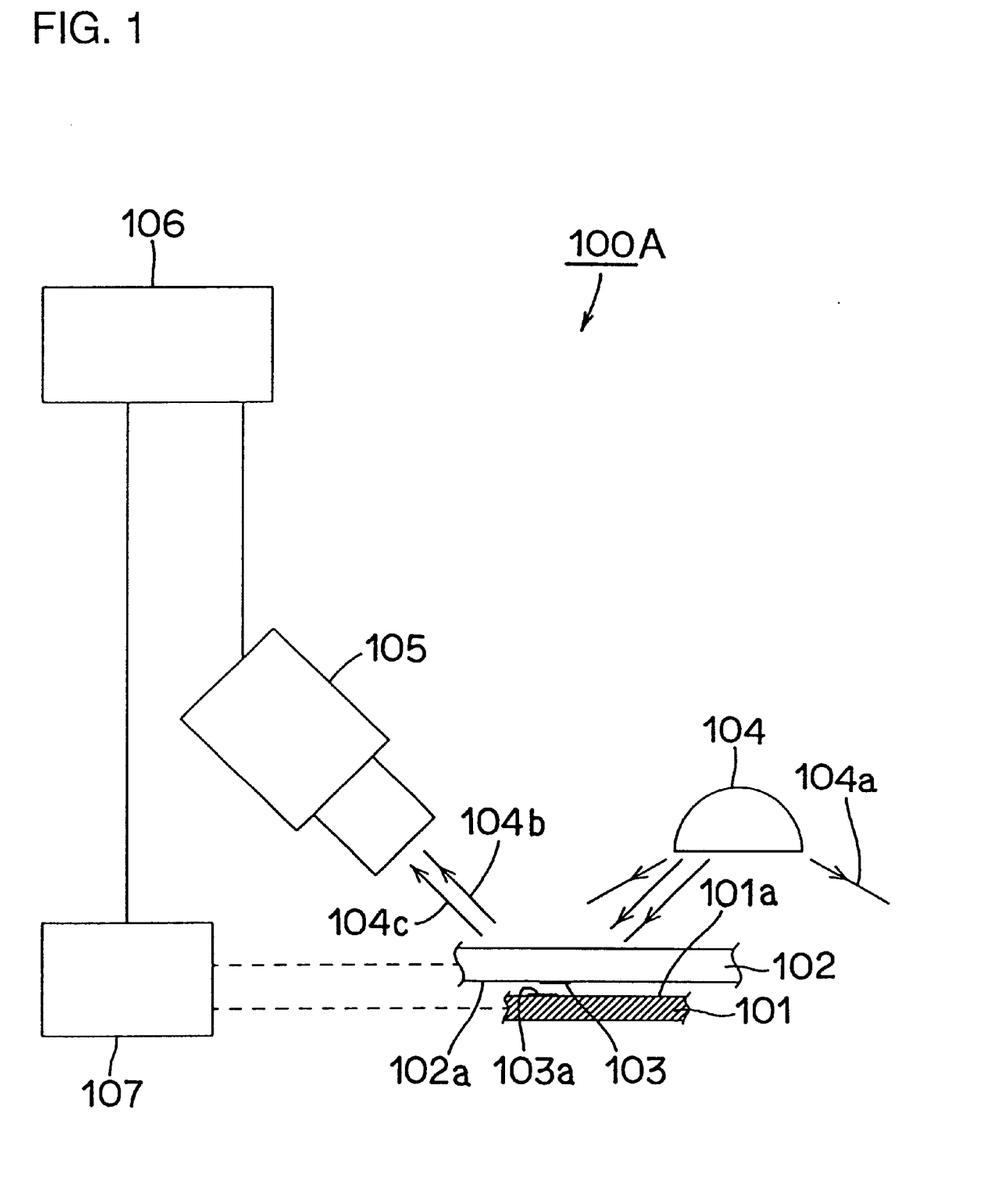
FIG. 1 is a schematic diagram showing a structure of a clearance measuring device 100A according to a first embodiment of the present invention.

FIG. 1 is a schematic diagram showing a general structure of a clearance measuring device 100A of the first embodiment.

Referring to FIG. 1, a general structure of a clearance measuring device 100A of the present embodiment will be described. A photomask 102 is arranged above a plate 101 with a prescribed clearance. The clearance between plate 101 and photomask 102 can be adjusted by a clearance adjusting device 107. A clearance measuring mark 103 is formed on photomask 102 in a prescribed position on a surface 102a opposite to plate 101.

A light irradiation device 104 is arranged above photomask 102 for directing light to a region including clearance measuring mark 103.

Provided diagonally above photomask 102 is a CCD camera 105 as a light sensor sensing light 104b reflected by a surface 102a of photomask 102 opposite to plate 101 and a light 104c reflected by a surface 101a of plate 101 opposite to the photomask, which lights are both divided from light 104a directed from light irradiation device 104.

A processor 106 for performing an image process on an image pattern sensed by device CCD camera 105 for calculation is connected to CCD camera 105. Clearance adjusting device 107 is controlled based on the calculation result from processor 106.

Second Embodiment

Figure 2:
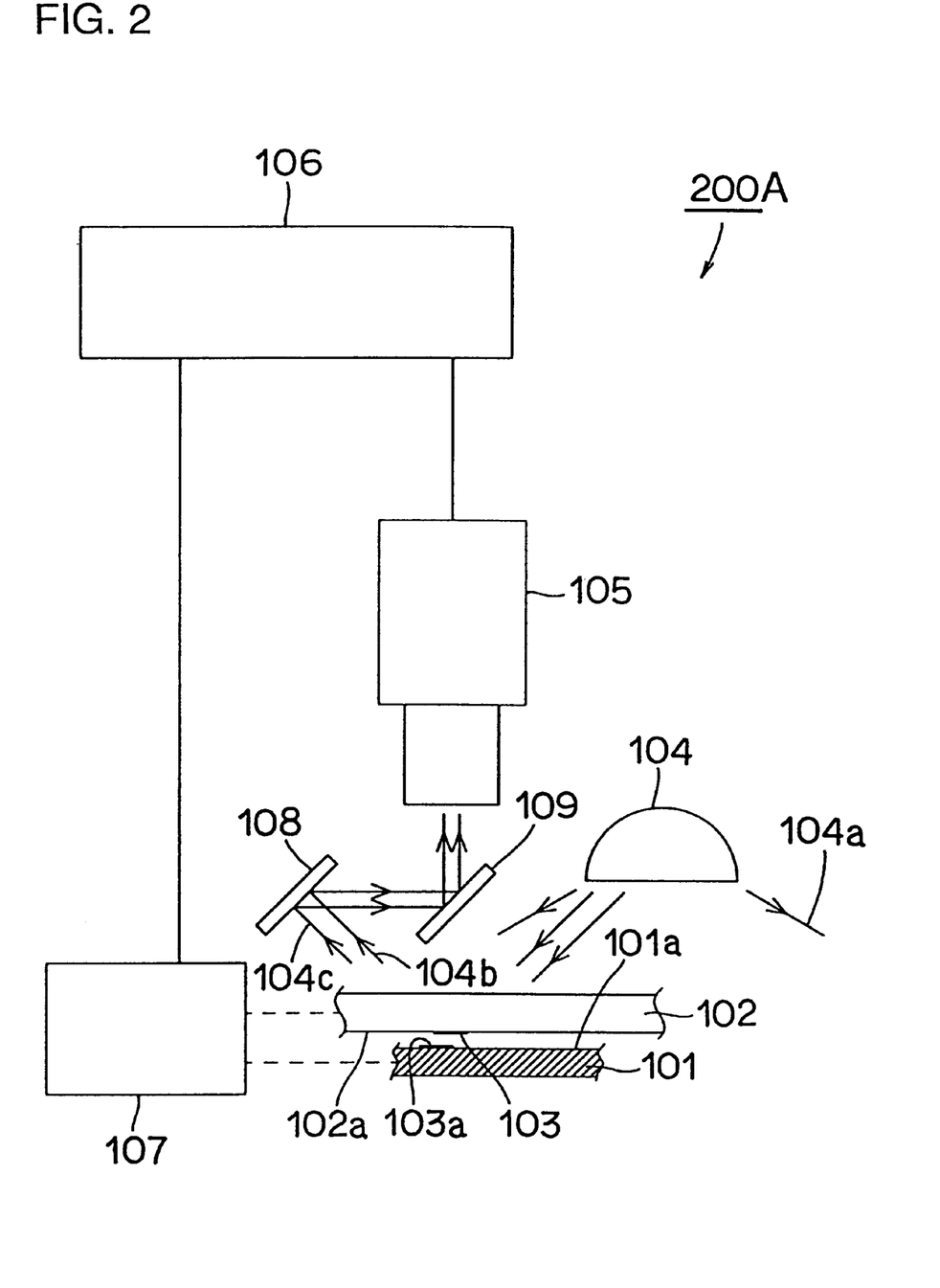
FIG. 2 is a schematic diagram showing a structure of a clearance measuring device 200A according to a second embodiment of the present invention.

Referring to FIG. 2, a general structure of a clearance measuring device 200A of the present embodiment will be described. A photomask 102 is arranged above plate 101 with a prescribed clearance. The clearance between plate 101 and photomask 102 can be adjusted by a clearance adjusting device 107. A clearance measuring mark 103 is formed on photomask 102 in a prescribed position on a surface 102a which is opposite to plate 101.

Provided above photomask 102 is a light irradiation device 104 for irradiating a region including clearance measuring mark 103 with light.

Provided above photomask 102 is a CCD camera 105 as a light sensor sensing a light 104b reflected by a surface 102a of photomask 102 opposite to plate 101 and a light 104c reflected by a surface 101a of plate 101 opposite to the photomask, which lights are divided from light 104a directed from light irradiation device 104. Further, mirrors 108 and 109 are arranged above photomask 102 for directing lights 104b and 104c to CCD camera 105.

Thus, clearance measuring device 200 of the present embodiment differs from clearance measuring device 100 of the first embodiment in that mirrors 108 and 109 are arranged in an optical path of lights 104b and 104c directed to CCD camera 105.

A processor 106 for performing an image process on an image pattern sensed by CCD camera 105 for calculation is connected to CCD camera 105. Clearance adjusting device 107 is controlled based on the calculation result from processor 106.

Third Embodiment

Figure 3A:
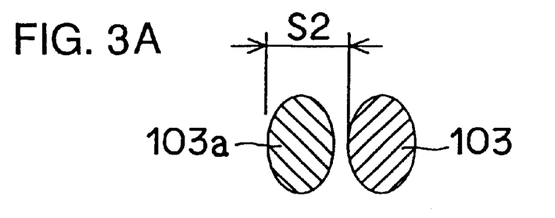
FIGS. 3A and 3B are schematic diagrams respectively shown in conjunction with first clearance measuring methods using clearances measuring devices 100A and 200A of the first and second embodiments.
Figure 3B:
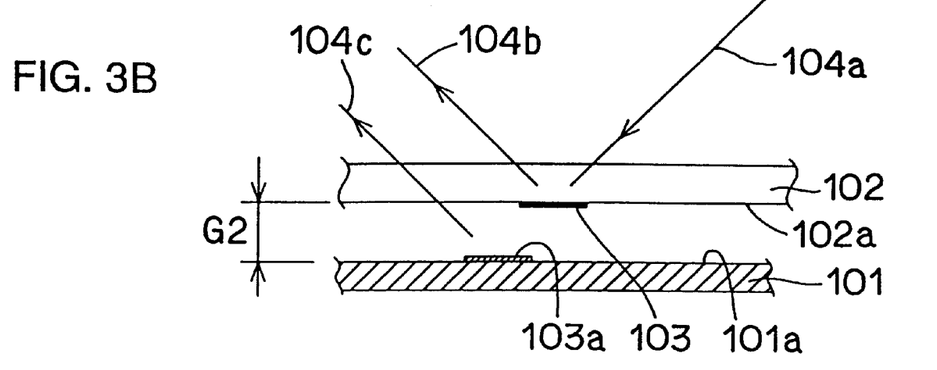

A clearance measuring method using clearance measuring devices 100A and 200A of the above described first and second embodiments will be described with reference to FIGS. 3A and 3B. FIGS. 3A and 3B relate to the case where the shape of clearance measuring mark 103 is circular.

FIGS. 3A and 3B respectively show an image pattern sensed by CCD camera 105 and a longitudinal cross sectional view of plate 101 and photomask 102. Light 104a is directed to a region of photomask 102 including clearance measuring mark 103 by light irradiation device 104.

Light 104b reflected by surface 102a of photomask 102 opposite to plate 101 and light 104c reflected by surface 101a of plate 101 opposite to photomask 102 of light 104a are directed to CCD camera 105. Thus, clearance measuring mark 103 and an image 103a of the clearance measuring mark projected onto surface 101a of plate 101 opposite to photomask 102 are sensed as image patterns by CCD camera 105.

Referring to FIGS. 3A and 3B, an amount of displacement of image 103a of the clearance measuring mark with respect to clearance measuring mark 103 changes in accordance with the clearance between photomask 102 and plate 101. In other words, the amount of displacement S1 of image 103a of the clearance measuring mark from clearance measuring mark 103 is proportional to the difference between photomask 102 and plate 101.

Clearance measuring mark 103 on photomask 102 and image 103a of the clearance measuring mark projected onto plate surface 101a are sensed as image patterns by CCD camera 105, so that the amount of displacement of image 103a of the clearance measuring mark from clearance measuring mark 103 can be calculated by processor 106 using an image process or the like.

Based on the calculated amount of displacement of image 103a from clearance measuring mark 103, the clearance between photomask 102 and plate 101 can be adjusted to a prescribed value by clearance adjusting device 107.

Fourth Embodiment

Figure 7:
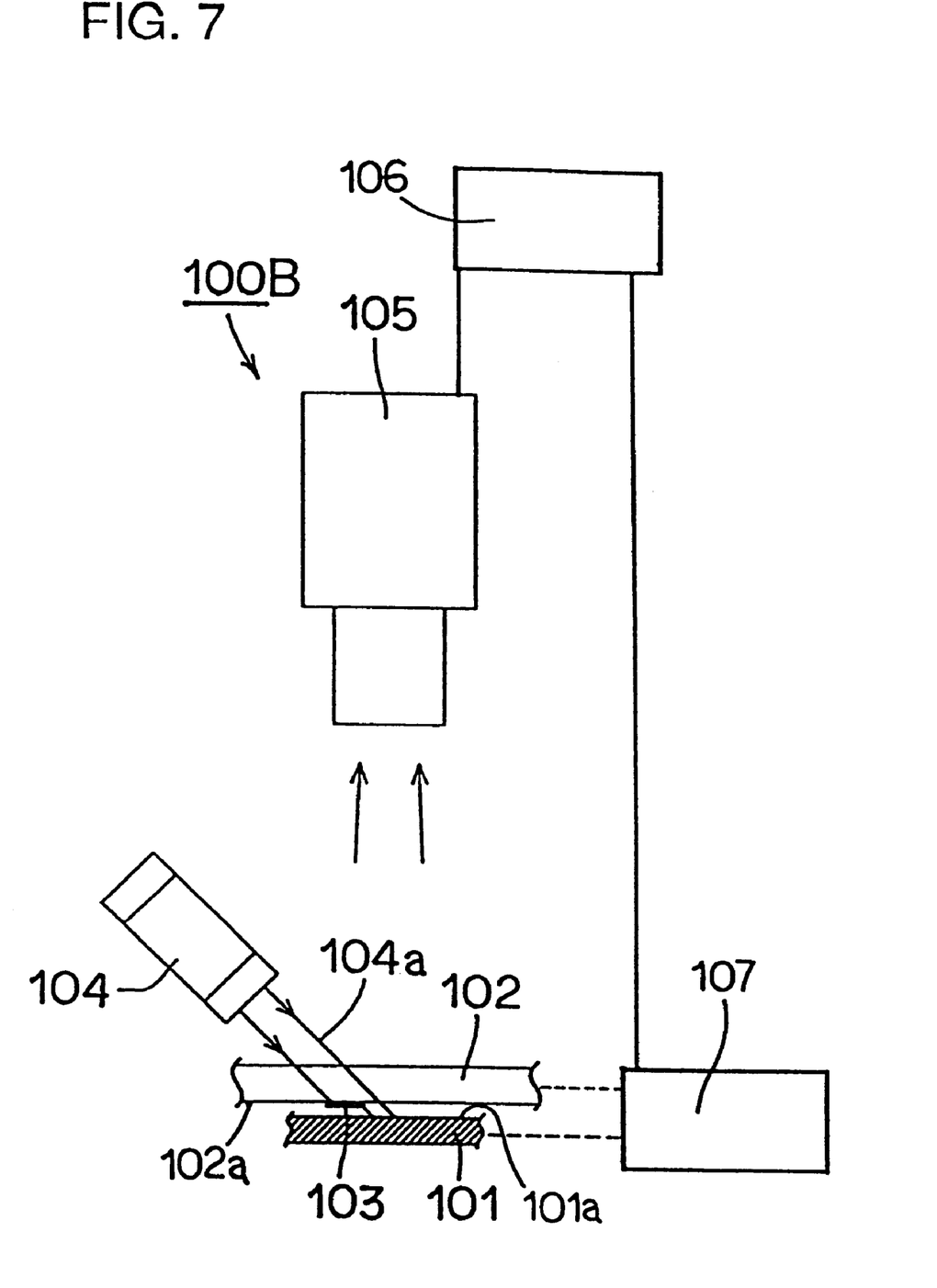
FIG. 7 is a schematic diagram showing a structure of a clearance measuring device 100B according to a fourth embodiment of the present invention.
Figure 8A:
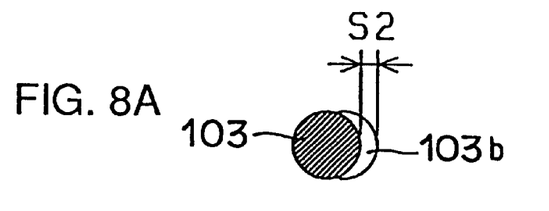
FIGS. 8A and 8B are schematic diagrams shown in conjunction with a first clearance measuring method using clearance measuring device 100B according to the fourth embodiment.
Figure 8B:
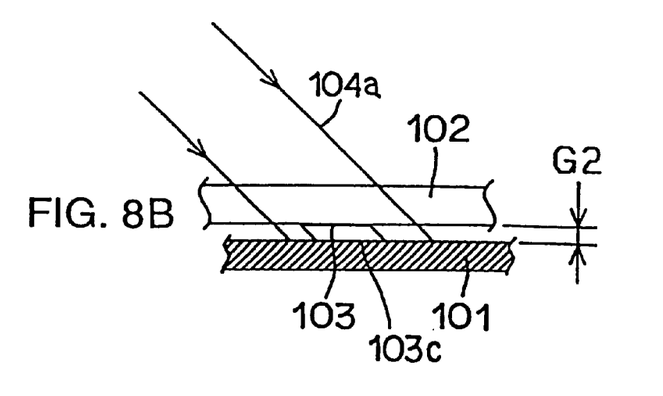

Referring to FIGS. 7, 8A and 8B, a clearance measuring device and method of the fourth embodiment will be described.

First, referring to FIG. 7, a general structure of a clearance measuring device 100A of the present embodiment will be described. A photomask 102 is arranged above a plate 101 with a prescribed clearance. The clearance between plate 101 and photomask 102 can be adjusted by a clearance adjusting device 107. A clearance measuring mark 103 is formed in a prescribed position on surface 102a of photomask 102 which is opposite to plate 101.

Provided above photomask 102 is a light irradiation device 104 for diagonally and downwardly directing light to plate 101 in one direction.

Provided above photomask 102 is a CCD camera 105 as a light sensor sensing the light directed from light irradiation device 104 and reflected by photomask surface 102a and plate surface 101a which is opposite to the photomask.

CCD camera 105 is provided with a processor 106 for performing an image process on image data sensed from CCD camera 105 for calculation. Clearance adjusting device 107 is controlled based on the calculation result from processor 106.

Now, referring to FIGS. 8A and 8B, a clearance measuring method using the above described clearance measuring device 100B will be described. FIGS. 8A and 8B show the case where the shape of clearance measuring mark 103 is circular.

FIGS. 8A and 8B respectively show an image pattern sensed by CCD camera 105 as well as a longitudinal cross sectional view of plate 101 and photomask 102. Light 104a is diagonally and downwardly directed to clearance measuring mark 103 on photomask 102 by light irradiation device 104. Clearance measuring mark 103 and a shadow 103b of clearance measuring mark 103, which is projected on plate surface 101a, are sensed as image patterns by CCD camera 105.

Referring to FIGS. 8A and 8B, an amount of change in shadow 103b with respect to clearance measuring mark 103 changes in accordance with the clearance between photomask 102 and plate 101. In other words, an amount of displacement S2 of clearance measuring mark 103 and shadow 103b of the clearance measuring mark is proportional to a distance G2 between photomask 102 and plate 101.

Thus, clearance measuring mark 103 of photomask 102 and shadow 103b of the clearance measuring mark projected on plate surface 101a are sensed as image patterns by CCD camera 105 for performing an image process by processor 106, so that the amount of displacement of clearance measuring mark 103 and shadow 103b can be calculated.

In accordance with the amount of displacement of clearance measuring mark 103 and shadow 103b of clearance measuring mark, the clearance between photomask 102 and plate 101 can accurately be adjusted to a prescribed value by clearance adjusting device 107.

Fifth Embodiment

Now, referring to FIGS. 9 to 11B, a clearance measuring device and method of the fifth embodiment will be described.

Figure 9:
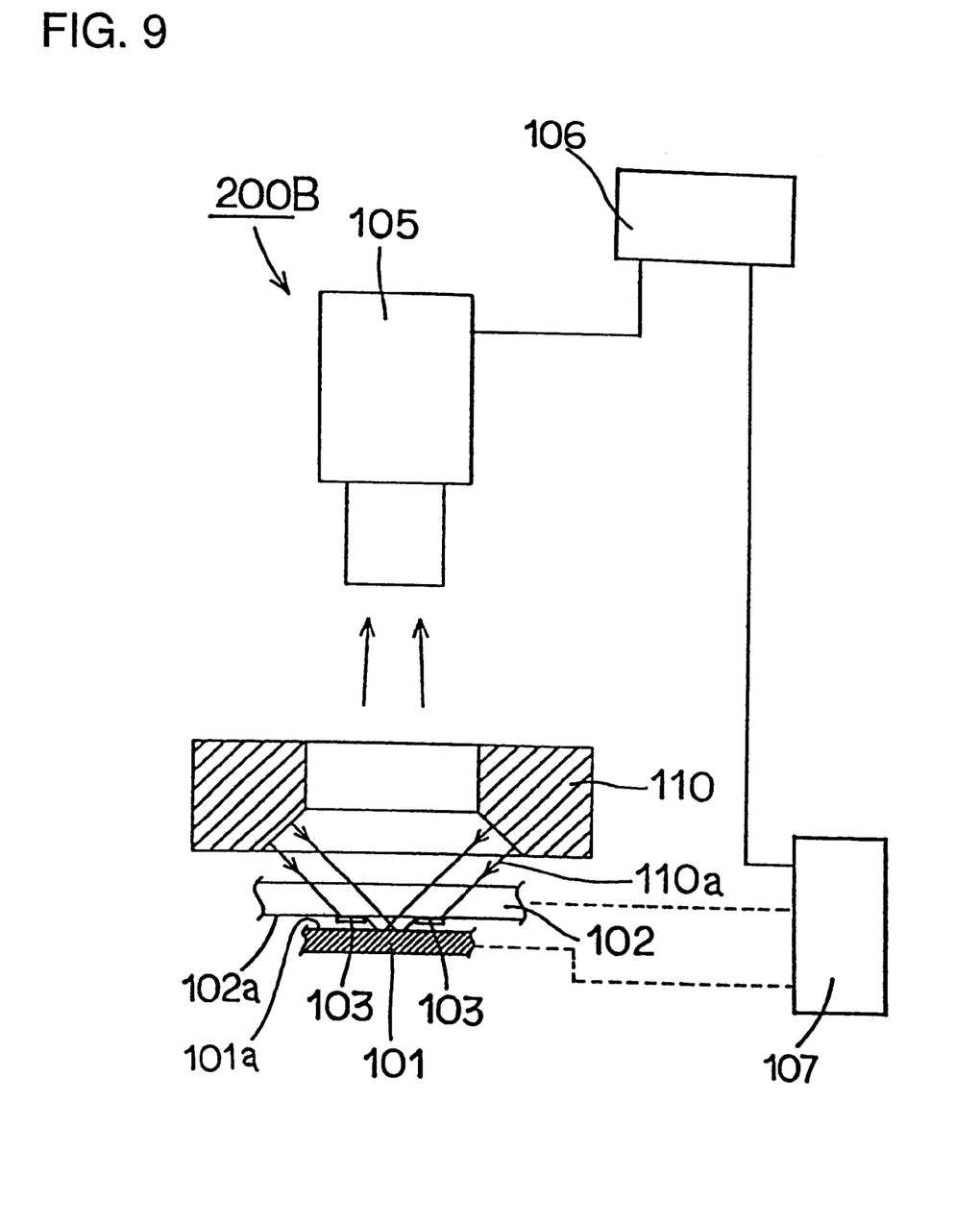
FIG. 9 is a schematic diagram showing a structure of a clearance measuring device 100B according to a fifth embodiment.

First, referring to FIG. 9, a general structure of clearance measuring device 200B of the present embodiment will be described. A photomask 102 is arranged above plate 101 with a prescribed clearance. The clearance between plate 101 and photomask 102 can be adjusted by a clearance adjusting device 107. A clearance measuring mark 103 is formed in a prescribed position on surface 102a of photomask 102 which is opposite to plate 101.

Provided above photomask 102 is a light irradiation device 110 in a ring like shape for diagonally and downwardly directing light to a region including clearance measuring mark 103 in all directions.

A CCD camera 105 is arranged above photomask 102 as a light sensor sensing the light directed from light irradiation device 110 and reflected by a surface 102a of photomask 102 which is opposite to plate 101 and a surface 101a of plate 101 which is opposite to the photomask.

CCD camera 105 is provided with a processor 106 for performing an image process on an image pattern obtained from CCD camera 105 for calculation. Clearance adjusting device 107 is controlled based on the calculation result from processor 106.

Figure 10A:
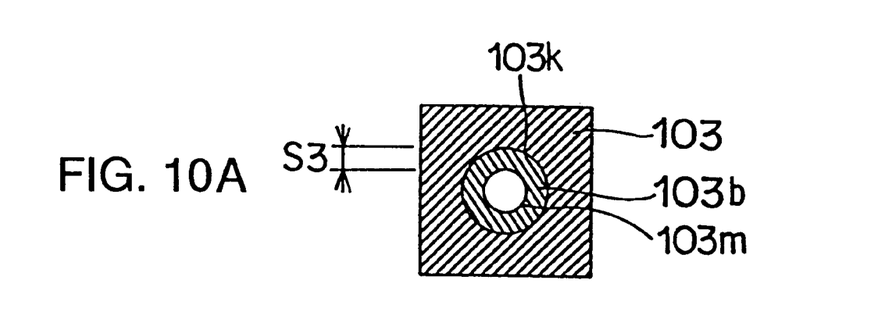
FIGS. 10A and 10B are schematic diagrams shown in conjunction with a first clearance measuring method using clearance measuring device 100B according to the fifth embodiment.
Figure 10B:
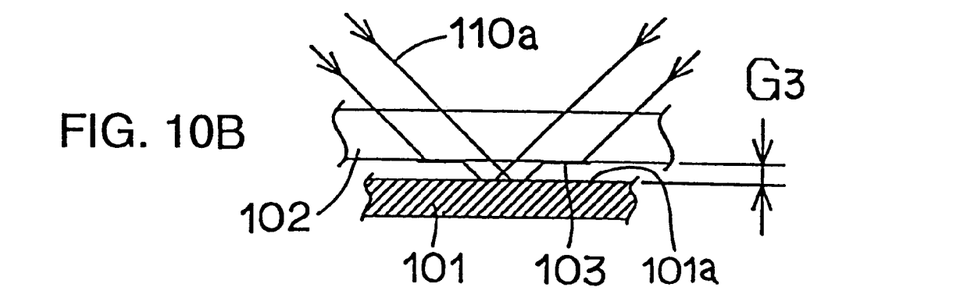
Figure 11A:
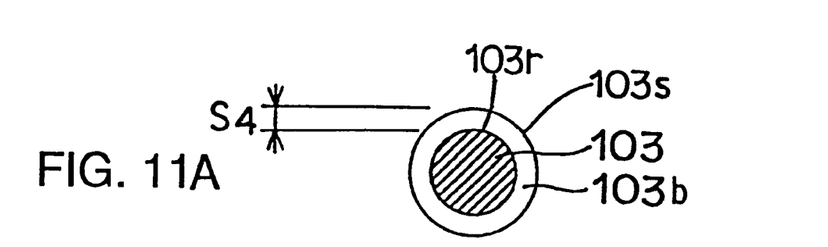
FIGS. 11A and 11B are schematic diagrams shown in conjunction with a second clearance measuring method using clearance measuring device 200B according to the fifth embodiment.
Figure 11B:
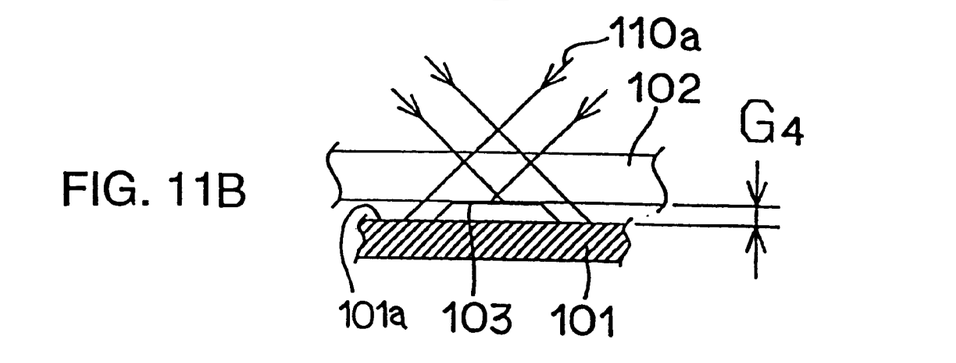

Next, a clearance measuring method using the above described clearance measuring device 200B will be described with reference to FIGS. 10A, 10B, 11A and 11B. FIGS. 10A and 10B relate to the case where the shape of clearance measuring mark 103 is circular when viewed from above and has a circular portion inside. FIGS. 11A and 11B relate to the case where the shape of clearance measuring mark 103 is circular when viewed from above and does not have a circular portion inside.

FIGS. 10A and 10B respectively shows an image pattern sensed by CCD camera 105 as well as a longitudinal cross sectional view of plate 101 and a photomask 102. Light 110a is diagonally and downwardly directed to clearance measuring mark 103 on photomask 102 in all directions by light irradiation device 110.

Clearance measuring mark 103 and shadow 103b of clearance measuring mark, which is an image of clearance measuring mark 103 projected onto plate 101, are sensed as image patterns by CCD camera 105. Further, an outer portion 103k in a ring like shape of clearance measuring mark 103 and an inner circle 103m of shadow 103b of clearance measuring mark, which is an image defined by outer portion 103k, are sensed as image patterns by CCD camera 105.

An amount of change in shape of inner circle 103m projected on plate 101 from outer portion 103k changes in accordance with the clearance between photomask 102 and plate 101. In other words, a difference in shape S3 between outer portion 103k and inner circle 103m is proportional to clearance G3 between photomask 102 and plate 101.

Thus, the amount of change of inner circle 103m from outer portion 103k is sensed as image data by CCD camera for an image process by processor 106, so that the difference between outer portion 103k and inner circle 103m can be calculated.

The clearance between photomask 102 and plate 101 can accurately be adjusted to a prescribed value by clearance adjusting device 107 in accordance with the calculated difference between outer portion 103k and inner circle 103m.

It noted that the position and shape of outer portion 103k can preliminary be determined, so that the difference between outer portion 103k and inner circle 103m can be calculated only by measuring the position and shape of inner circle 103m.

FIGS. 11A and 11B respectively show an image pattern sensed by CCD camera 105 as well as a longitudinal cross sectional view of plate 101 and photomask 102. Light 110a is diagonally and downwardly directed to clearance measuring mark 103 on photomask 102 in all directions by light irradiation device 110.

Clearance measuring mark 103 and shadow 103b of clearance measuring mark, which is an image of clearance measuring mark 103, are sensed by CCD camera 105 as image patterns. Further, outer portion 103r of clearance measuring mark 103 and an outer portion 103s of shadow 103b of clearance measuring mark which is an image defined by outer portion 103r are sensed as image patterns by CCD camera 105.

An amount of difference between portion 103r of clearance measuring mark 103 and outer portion 103s of shadow 103b of clearance measuring mark changes in accordance with the clearance between photomask 102 and plate 101. In other words, a difference S4 between portion 103r of clearance measuring mark 103 and outer portion 103s of shadow 103b is proportional to clearance G4 between photomask 102 and plate 101.

Thus, portion 103r of clearance measuring mark 103 and outer portion 103s of shadow 103b are sensed as image data by CCD camera 105 for an image process by processor 106, so that the difference between portion 103r of clearance measuring mark 103 and outer portion 103s of shadow 103b can be calculated.

Based on the calculated amount of change in shape of outer portion 103s from portion 103r, the clearance between photomask 102 and plate 101 can accurately be adjusted to a prescribed value by clearance adjusting device 107.

It is noted that the shape of portion 103r of clearance measuring mark 103 can preliminary be determined, so that the difference between portion 103r of clearance measuring mark 103 and outer portion 103s of shadow 103b can be calculated only by measuring the position of outer portion 103s of shadow 103b.

In the clearance measuring device and method of the above described embodiment, if there is a prescribed clearance between photomask 102 and plate 101, image 103a or shadow 103b of the clearance measuring mark is projected onto plate surface 101a.

The relative positional relationship between clearance measuring mark 103 on photomask 102 and image 103a or shadow 103b changes in accordance with the clearance between the photomask 102 and plate 101. In other words, the relative positional relationship between clearance measuring mark 103 on photomask 102 and image 103a or shadow 103b is proportional to the clearance between the photomask and the plate.

Accordingly, clearance measuring mark 103 on photomask 102 and image 103a reflected by plate surface 101a or shadow 103b projected on plate surface 101a are sensed by a light sensor, i.e., CCD camera 105, so that the relative positional relationship between clearance measuring mark 103 on photomask 102 and image 103a or shadow 103b can be calculated by the processor such as an image processor.

The clearance between photomask 102 and plate 101 can be accurately adjusted to a prescribed value by clearance adjusting device 106 based on the calculation result.

Figure 4:
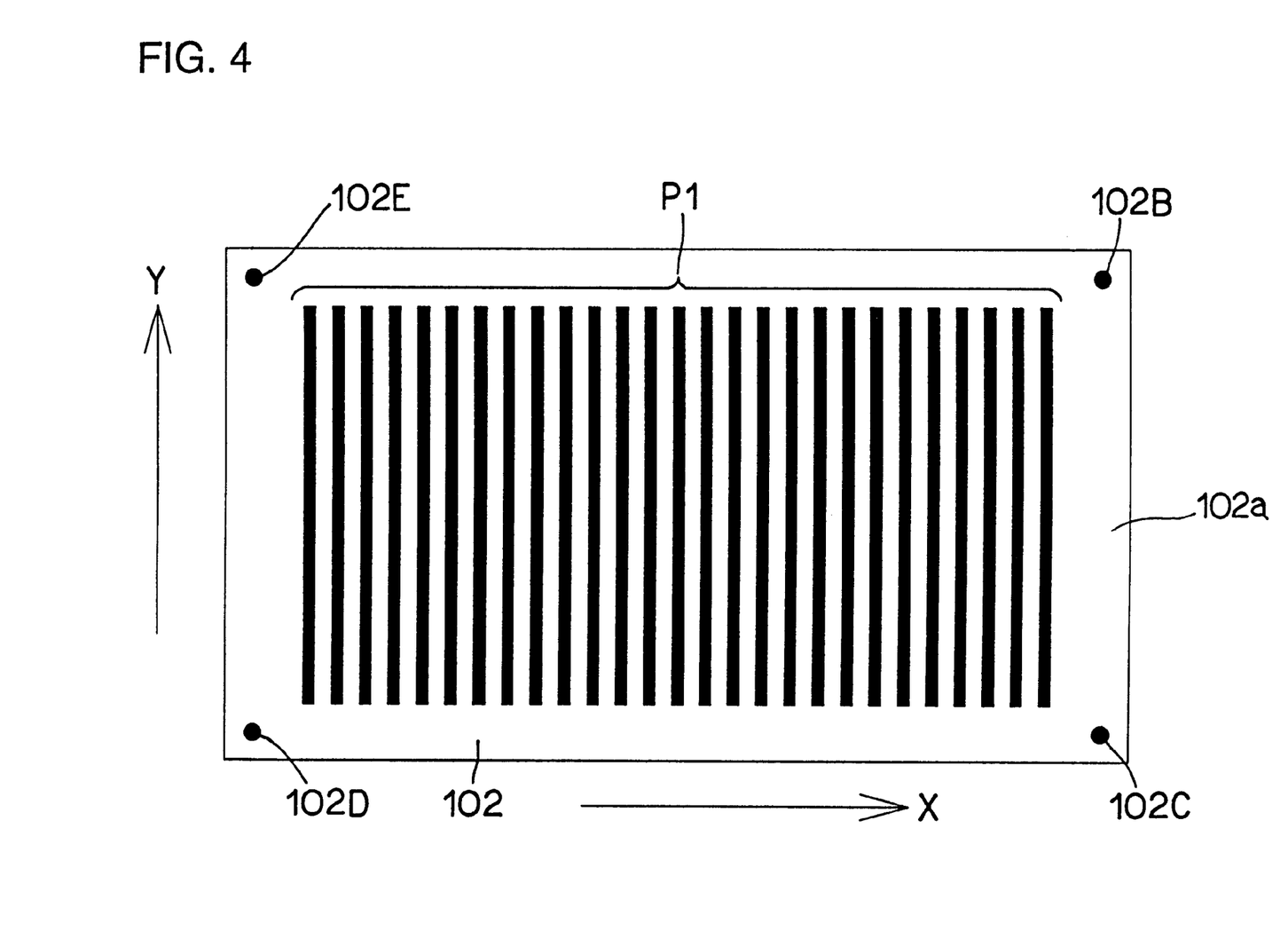
FIG. 4 is a view showing an alignment mark and a pattern P1 on a photomask 102 as well as X and Y directions of the photomask.

It is noted that, in each of the above described embodiments, alignment marks (102B, 102C, 102D, 102E) used for aligning photomask 102 and plate 101 can be used as clearance measuring mark 103 as shown in FIG. 4. Conversely, clearance measuring mark 103 may be used as an alignment mark for aligning photomask 102 and plate 101. Thus, the clearance measuring device and method of each of the embodiments can be achieved without increasing the number of patterns to be formed on photomask 102.

Further, as shown in FIG. 4, a portion of a pattern P1 on photomask 102 which is to be transferred onto plate 101 may be used as clearance measuring mark 103. Thus, the clearance measuring device and method of each of the embodiments can be implemented without increasing the number of patterns to be formed on photomask 102.

In the above described first to third embodiments, the amount of displacement of image 103a from clearance measuring mark 103 is used as the relative positional relationship between clearance measuring mark 103 and image 103a. However, an amount of change in shape of image 103a from clearance measuring mark 103 may be used.

In each of the above described embodiments, preferably, CCD camera 105 is provided with a mechanism capable of moving in X and Y directions (FIG. 4) on photomask surface 102a. Thus, the clearance between plate 101 and photomask 102 can readily be measured at a plurality of locations.

Figure 5:
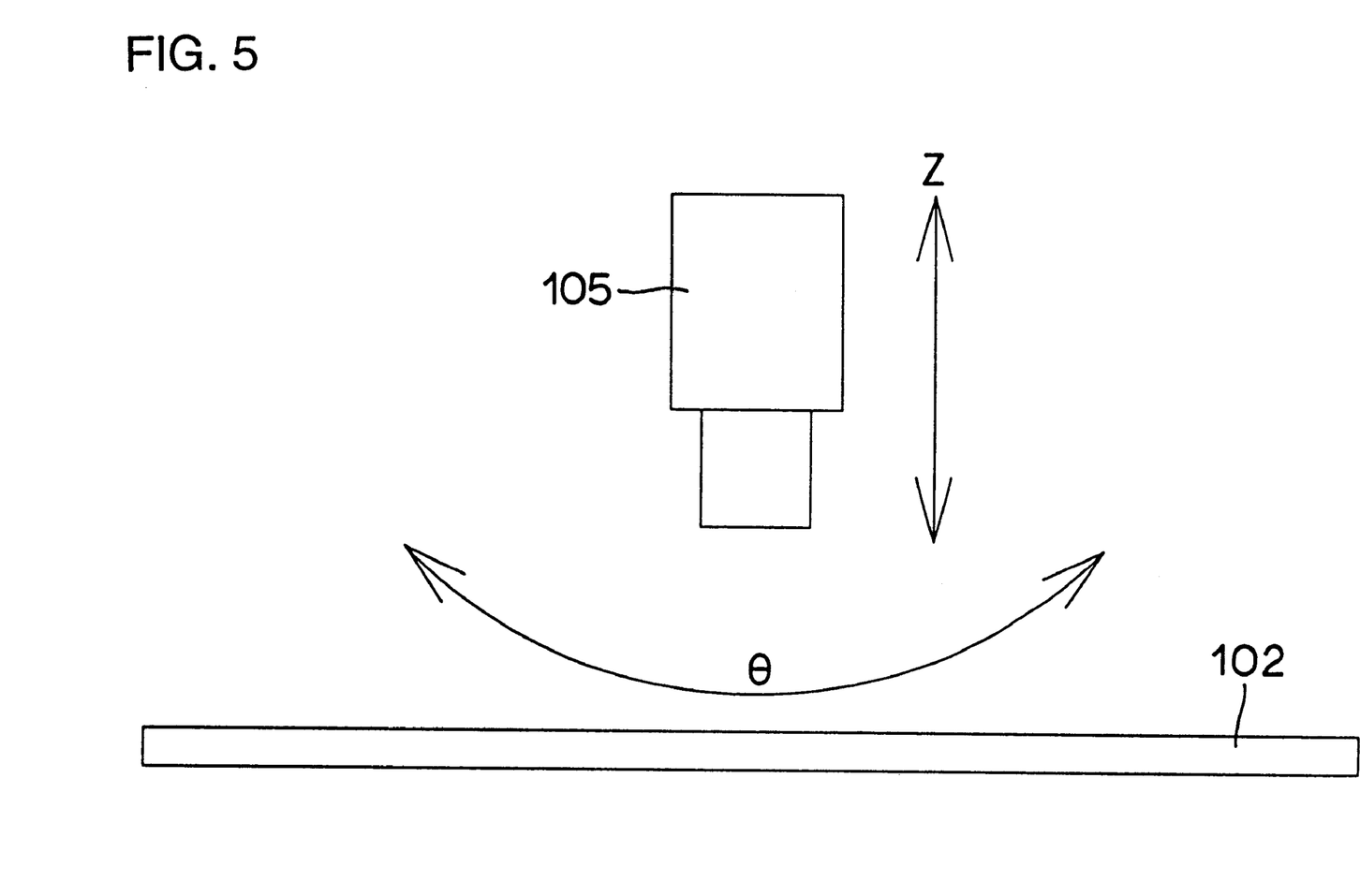
FIG. 5 is a schematic diagram showing a mechanism capable of moving in a direction (Z direction) perpendicular to the photomask and a mechanism capable of adjusting an angle with respect to the photomask (θ direction) provided in the CCD camera.

Preferably, CCD camera 105 is provided with a mechanism capable of moving in a direction perpendicular to photomask surface 102a (FIG. 5, Z direction). More preferably, a mechanism capable of adjusting an angle with respect to photomask surface 102a (FIG. 5, θ direction) is provided. Thus, CCD camera used for aligning photomask 102 and plate 101 can be used as a light sensor sensing both light 104b and 104c, so that a dedicated CCD camera for sensing light 104b and 104c is not necessary. As a result, the mechanism of the clearance measuring device can be simplified.

Processor 106 may change and use a program for aligning photomask 102 and plate 101 in order to calculate the relative relationship between clearance measuring mark 103 and image 103a or shadow 103b. Thus, a dedicated processor is not necessary and the mechanism of the clearance measuring device can be simplified.

In each of the above described embodiments, one CCD camera 105 is provided as a light sensor for sensing clearance measuring mark 103 and image 103a or shadow 103b of clearance measuring mark 103. However, two CCD cameras may be provided for clearance measuring mark 103 and image 103a or shadow 103b of clearance measuring mark 103, respectively.

Figure 6:
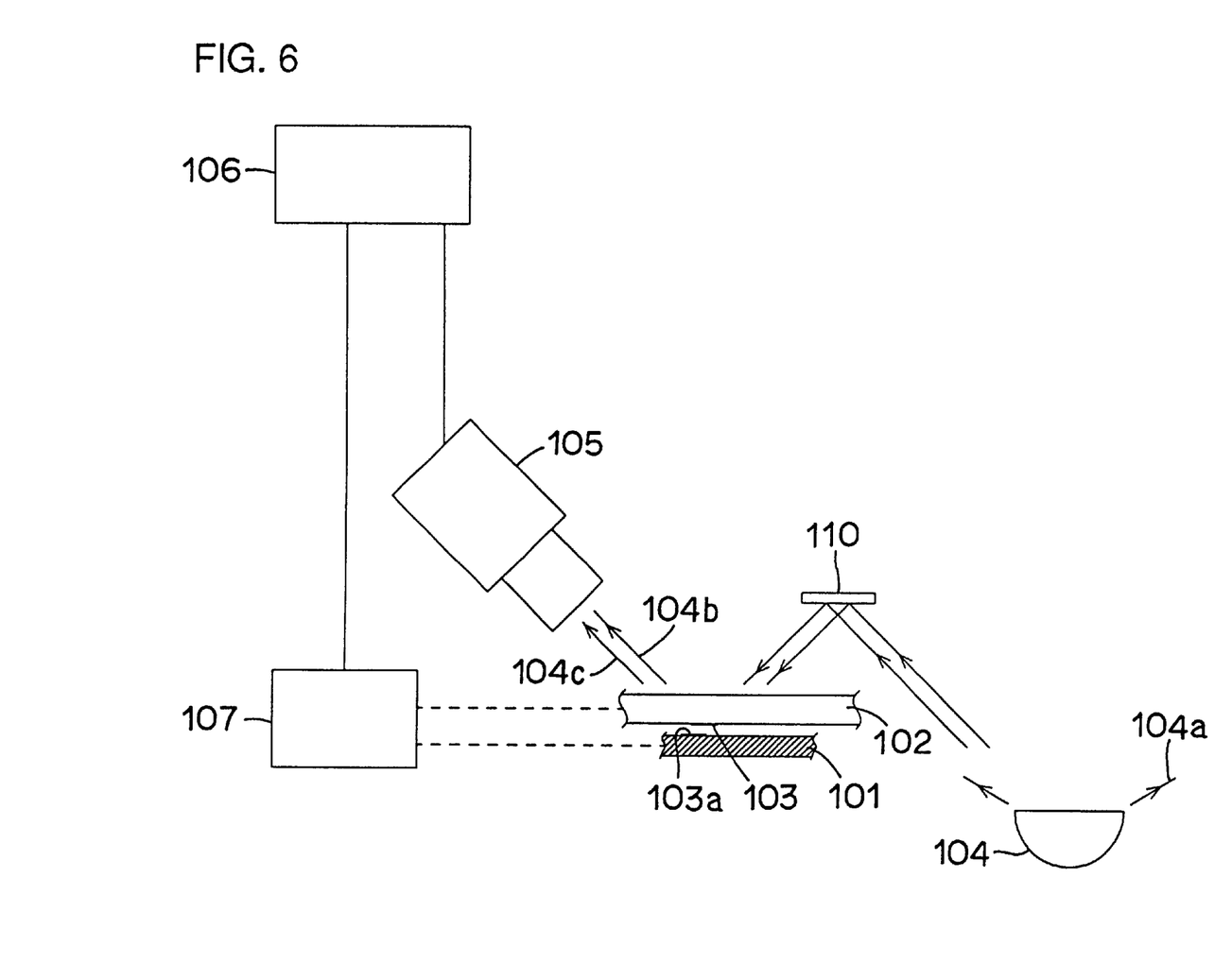
FIG. 6 is a schematic diagram showing a structure of a clearance measuring device according to another embodiment of the present invention.

In each of the above described embodiments, light irradiation device 104 is provided on the same side as CCD camera 105 (on the side opposite to that on which plate 101 is arranged when viewed from photomask 102). However, as shown in FIG. 6, it may be provided on the side opposite to that on which CCD camera is 105 is provided (on the side plate 101 is arranged when viewed from photomask 102).

In addition, a light source directing light with a long wavelength of at least that of yellow light may be used as light irradiation device 104, or a laser beam may be used as the light source. Thus, the transfer of the pattern on photomask 102 onto the plate by light irradiation is not affected.

A light irradiation device used for aligning photomask 102 and plate 101 is also used as light irradiation device 104. Thus, a dedicated light irradiation device is not necessary and a mechanism of the clearance measuring device can be simplified.

It is noted that, in each of the above described embodiments, light irradiation device 104 is provided for clearly projecting image 103a or shadow 103b of clearance measuring mark 103 on photomask 102 onto plate surface 101a. If, for example, image 103a or shadow 103b of the clearance measuring mark is sufficiently clearly projected onto plate surface 101a by an existing light at the place where clearance measuring device 100 is provided, light irradiation device 104 is not necessarily required. Thus, a mechanism of the clearance measuring device can be simplified.

In addition, although the CCD camera is used as a light sensor in the above described embodiments, a light sensor having a similar function may be used.

According to the clearance measuring device and method of the present invention, when the region including the clearance measuring mark of the photomask is irradiated with light, if there is a prescribed clearance between the photomask and the plate, the image or shadow of the mark is projected on the plate surface.

The amount of displacement or change in shape of the image or shadow of the clearance measuring mark changes in accordance with a clearance between the photomask and the plate based on a relative relationship between the image or shadow and the mark on the photomask. In other words, the amount of displacement or change in shape of the image or shadow of the clearance measuring mark is proportional to the clearance between the photomask and the plate.

Therefore, the clearance measuring mark and the image or shadow of the mark are sensed by the light sensor, and the amount of displacement or change of the clearance measuring mark of the photomask and the image or shadow of the clearance measuring mark are calculated by a processor performing for example an image process.

Based on the calculation result, the clearance between the photomask and the plate can accurately be adjusted to a prescribed value by a clearance adjusting device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clearance measuring device measuring a clearance between a photomask and a plate for adjusting said clearance between said photomask and said plate to a prescribed value in accordance with the measurement data in an exposure apparatus transferring a pattern on said photomask onto said plate by directing light to said plate through said photomask, said photomask having a clearance measuring mark in a prescribed position on a surface opposite to said plate, comprising:

at least one light sensor for sensing an image or shadow of said clearance measuring mark projected on said plate by irradiating said clearance measuring mark and a region including said clearance measuring mark with light;

calculating means calculating a clearance between said photomask and said plate based on a relative positional relationship between said clearance measuring mark and said image or said shadow of said clearance measuring mark; and clearance adjusting means for adjusting the clearance between said photomask and said plate to a prescribed value by relatively moving said photomask and said plate based on the calculation result from said calculating means.

2. The clearance measuring device according to claim 1, wherein an alignment mark used for aligning said photomask and said plate is used as said clearance measuring mark.

3. The clearance measuring device according to claim 1, wherein a portion of said pattern on said photomask to be transferred onto said plate is used as said clearance measuring mark.

4. The clearance measuring device according to claim 1, wherein said light sensor is provided with a mechanism movable in X and Y directions of said photomask.

5. The clearance measuring device according to claim 1, wherein said light sensor is provided with a mechanism movable in a direction perpendicular to a surface of said photomask.

6. The clearance measuring device according to claim 1, wherein said light sensor is provided with a mechanism capable of adjusting an angle with respect to the surface of said photomask.

7. The clearance measuring device according to claim 1, further comprising at least one mirror in an optical system for sensing said clearance measuring mark and said image or shadow of said clearance measuring mark by said light sensor.

8. The clearance measuring device according to claim 1, wherein a processor for aligning said photomask and said plate is used as said calculating means.

9. The clearance measuring device according to claim 1, wherein a CCD camera for aligning said photomask and said plate is used as said light sensor.

10. The clearance measuring device according to claim 1, further comprising at least one light irradiation means for irradiating said region including said clearance measuring mark with light.

11. The clearance measuring device according to claim 10, wherein light irradiation means for aligning said photomask and said plate is used as said light irradiation means.

12. The clearance measuring device according to claim 10, wherein said light irradiation means has at least one mirror in an optical system.

13. A clearance measuring method using a photomask having a clearance measuring mark for measuring a clearance between said photomask and a plate and adjusting said clearance between said photomask and said plate to a prescribed value in an exposure apparatus directing a light to said plate through said photomask for transferring a pattern on said photomask onto said plate, wherein said clearance between said photomask and said plate is calculated based on a relative positional relationship between an image or shadow of said clearance measuring mark projected onto said plate and said clearance measuring mark by irradiating a region including said clearance measuring mark with light, and said photomask and said plate are relatively moved based on the calculation result, so that said clearance between said photomask and said plate is adjusted to a prescribed value.

14. The clearance measuring method according to claim 13, wherein said light is directed from at least one light source to said region including said clearance measuring mark.

* * * * *

UNITED STATES PATENT AND TRADEMARK OFFICE
CERTIFICATE OF CORRECTION

PATENT NO. : 6,320,659 B1
DATED : November 20, 2001
INVENTOR(S) : Eiichi Miyake et al.

It is certified that error appears in the above-identified patent and that said Letters Patent is hereby corrected as shown below:

<u>Title page,</u>
Item [30] Foreign Application Priority Data, delete
"Sep. 22, 1998 (JP)..............10-268093"

Signed and Sealed this

Twenty-fifth Day of June, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO.      : 6,320,659 B1                                           Page 1 of 1
DATED           : November 20, 2001
INVENTOR(S)     : Eiichi Miyake et al.

It is certified that error appears in the above-identified patent and that said Letters Patent is hereby corrected as shown below:

<u>Title page,</u>
Item [30], Foreign Application Priority Data, change "12-012538" to
-- 2000-012538 --.

Signed and Sealed this

Thirteenth Day of August, 2002

Attest:

JAMES E. ROGAN
Attesting Officer   Director of the United States Patent and Trademark Office